(12) United States Patent
Huang et al.

(10) Patent No.: US 11,309,295 B2
(45) Date of Patent: Apr. 19, 2022

(54) SEMICONDUCTOR DEVICE PACKAGE (71) Applicant: Advanced Semiconductor Engineering, Inc., Kaohsiung (TW)

(72) Inventors: Wen Hung Huang, Kaohsiung (TW); Wen Chieh Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 185 days.

(21) Appl. No.: 16/551,180

(22) Filed: Aug. 26, 2019

(65) Prior Publication Data

US 2021/0066264 A1 Mar. 4, 2021

(51) Int. Cl.
| | |
|---|---|
| H01L 23/13 | (2006.01) |
| H01L 25/16 | (2006.01) |
| H01L 23/538 | (2006.01) |
| H01L 23/498 | (2006.01) |
| H01L 23/31 | (2006.01) |
| H01L 23/00 | (2006.01) |
| H01L 21/48 | (2006.01) |
| H01L 21/683 | (2006.01) |

(52) U.S. Cl.
CPC .......... *H01L 25/16* (2013.01); *H01L 21/4857* (2013.01); *H01L 21/6835* (2013.01); *H01L 23/13* (2013.01); *H01L 23/3128* (2013.01); *H01L 23/49816* (2013.01); *H01L 23/5383* (2013.01); *H01L 23/5386* (2013.01); *H01L 24/24* (2013.01); *H01L 2221/68345* (2013.01); *H01L 2221/68359* (2013.01); *H01L 2224/24225* (2013.01); *H01L 2224/24265* (2013.01); *H01L 2924/19041* (2013.01); *H01L 2924/19042* (2013.01); *H01L 2924/19043* (2013.01); *H01L 2924/19102* (2013.01)

(58) Field of Classification Search
CPC ... H05K 1/11; H05K 1/14; H05K 1/18; H05K 1/182–188; H05K 7/02; H05K 7/04; H01L 21/48; H01L 23/00; H01L 23/49; H01L 23/30; H01L 23/483; H01L 23/13; H01L 23/538; H01L 23/5383; H01L 25/16
USPC .............. 361/760–766, 790, 792–795; 257/685–730
See application file for complete search history.

(56) References Cited

U.S. PATENT DOCUMENTS

| | | | | |
|---|---|---|---|---|
| 4,423,465 A * | 12/1983 | Teng-Ching | ......... | H05K 5/0021 200/307 |
| 5,006,920 A * | 4/1991 | Schafer | ........ | H05K 7/02 257/700 |
| 6,157,533 A * | 12/2000 | Sallam | ........ | G06F 1/163 361/679.03 |
| 6,724,638 B1 * | 4/2004 | Inagaki | ........ | H01L 23/50 361/763 |

(Continued)

*Primary Examiner* — Tuan T Dinh
(74) *Attorney, Agent, or Firm* — Foley & Lardner LLP (57) ABSTRACT

A semiconductor device package includes a first passive component having a first surface and a second passive component having a second surface facing the first surface of the first passive component. The first surface has a recessing portion and the second surface includes a protruding portion within the recessing portion of the first surface of the first passive component. A contour of the protruding portion and a contour of the recessing portion are substantially matched. A method of manufacturing a semiconductor device package is also disclosed.

12 Claims, 10 Drawing Sheets

(56) References Cited

U.S. PATENT DOCUMENTS

| | | | | |
|---|---|---|---|---|
| 6,876,891 B1* | 4/2005 | Schuler | ............... | G05B 19/108 |
| | | | | 318/561 |
| 7,006,359 B2* | 2/2006 | Galvagni | ............... | H05K 1/188 |
| | | | | 29/841 |
| 8,217,272 B2* | 7/2012 | Choudhury | ............ | H01L 24/18 |
| | | | | 174/255 |
| 8,482,890 B2* | 7/2013 | Kim | ...................... | H05K 1/185 |
| | | | | 361/56 |
| 8,567,149 B2* | 10/2013 | Kuzmin | ................ | A63H 33/08 |
| | | | | 52/592.1 |
| 8,891,246 B2* | 11/2014 | Guzek | ................ | H01L 23/5389 |
| | | | | 361/766 |
| 8,908,387 B2* | 12/2014 | Mikado | ................... | H05K 3/30 |
| | | | | 361/772 |
| 8,941,016 B2* | 1/2015 | Okamoto | ................ | H01L 24/19 |
| | | | | 174/260 |
| 8,971,054 B2* | 3/2015 | Fujidai | ................ | H05K 3/4602 |
| | | | | 361/763 |
| 9,368,375 B2 | 6/2016 | Lai et al. | | |
| 10,155,153 B2* | 12/2018 | Binder | .................. | A63F 9/1044 |
| 2007/0242440 A1* | 10/2007 | Sugaya | ............ | H01L 23/49822 |
| | | | | 361/762 |
| 2008/0083149 A1* | 4/2008 | Zebersky | ............. | A63F 9/1044 |
| | | | | 40/716 |

* cited by examiner

SEMICONDUCTOR DEVICE PACKAGE

BACKGROUND

1. Technical Field

The present disclosure generally relates to a semiconductor device package and a method of manufacturing the same, and to a semiconductor device package including an electronic component embedded therein and a method of manufacturing the same.

2. Description of the Related Art

Electronic components (e.g., a capacitor, an inductor, or a resistor) can be embedded within a substrate to miniature the size of a semiconductor device package. In a comparative pick and place operation, each electronic component is picked, aligned, and placed in a corresponding cavity. Since the components are handled one by one, the operations may be time-consuming and inefficient.

SUMMARY

In one or more embodiments, a semiconductor device package includes a first passive component having a first surface and a second passive component having a second surface facing the first surface of the first passive component. The first surface has a recessing portion and the second surface includes a protruding portion within the recessing portion of the first surface of the first passive component. A contour of the protruding portion and a contour of the recessing portion are substantially matched.

In one or more embodiments, a semiconductor device package includes a substrate having a cavity, a first electronic component having a first surface, and a second electronic component having a second surface facing the first surface of the first electronic component. The first surface has a recessing portion and the second surface includes a protruding portion within the recessing portion of the first surface of the first electronic component. The first electronic component and the second electronic component are combined and accommodated in the cavity.

In one or more embodiments, a method of manufacturing a semiconductor package includes shaping a first surface of a first electronic component to have a recessing portion; and shaping a second surface of a second electronic component to have a protruding portion. A contour of the protruding portion and a contour of the recessing portion are substantially matched. The method further includes combining the first electronic component and the second electronic component. The method further includes providing a substrate having a cavity; and disposing the first electronic component and the second electronic component in the cavity.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1:
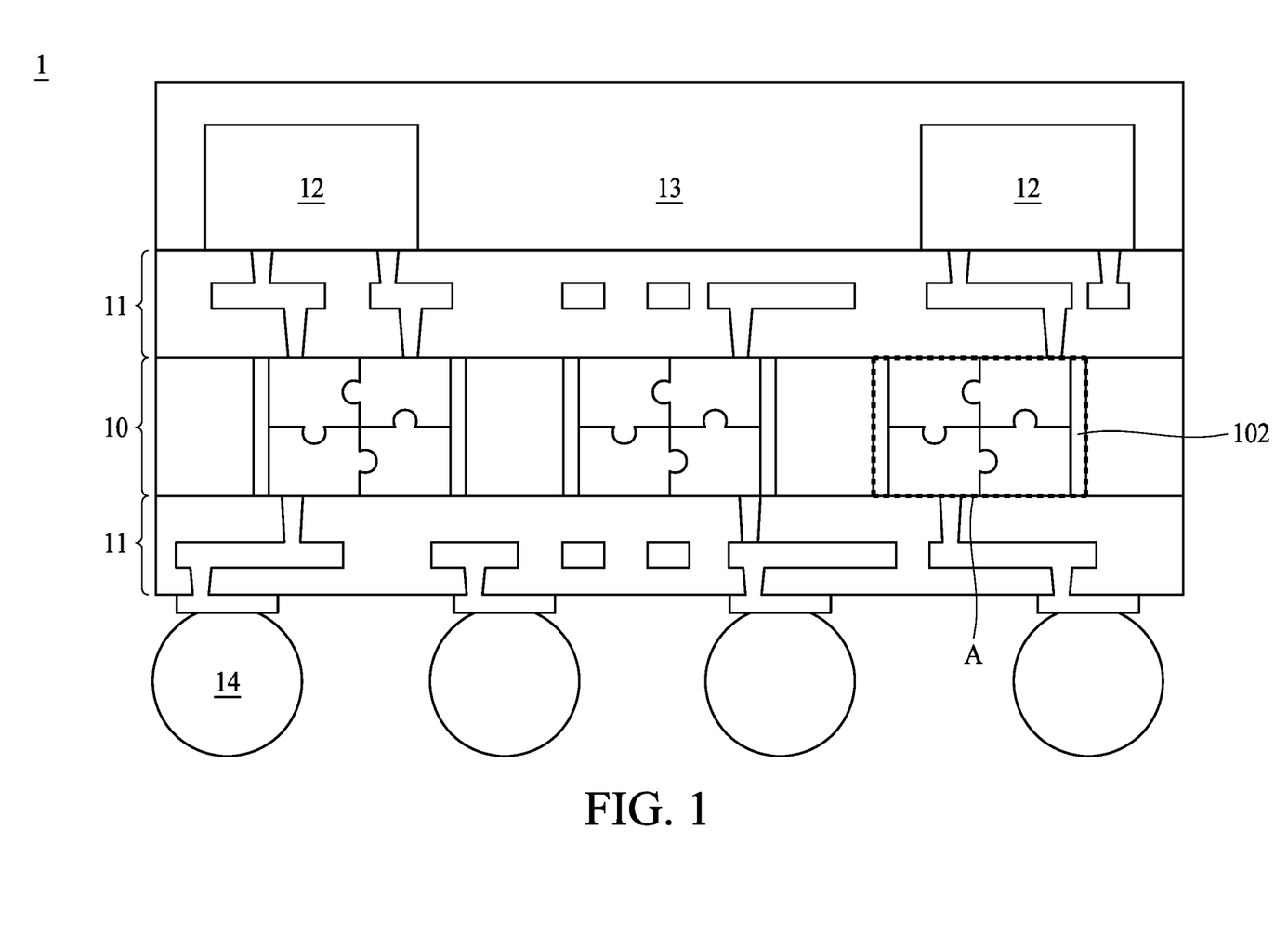
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a substrate 10, interconnection layers 11, electronic components 12, an encapsulating layer 13, and electrical contacts 14.

The substrate 10 may include a dielectric layer, which may include molding compounds, pre-impregnated composite fibers (e.g., pre-preg), borophosphosilicate glass (BPSG), silicon oxide, silicon nitride, silicon oxynitride, undoped silicate glass (USG), any combination thereof, or the like. Examples of molding compounds may include, but are not limited to, an epoxy resin including fillers dispersed therein. Examples of a pre-preg material may include, but are not limited to, a multi-layer structure formed by stacking or laminating a number of pre-impregnated materials or sheets.

As shown in the dotted box A in FIG. 1, the substrate 10 includes a plurality of cavities, and each of the cavity is provided with electronic components and a filler 102. For clarity and conciseness, not all elements in the substrate 10 in FIG. 1 are marked with reference symbols. Although there are four cavities illustrated in the substrate 10 in FIG. 1, the present disclosure is not limited thereto. In some embodiments, there may be any number of cavities in the substrate 10 depending on different design specifications. In addition, in some embodiments, there may be any number of electronic components in each of the cavities in the substrate 10 depending on different design specifications.

In some embodiments, the electronic components in the cavities of the substrate 10 may be an active component, such as an integrated circuit (IC) chip or a die. In some embodiments, the electronic components in the cavities of the substrate 10 may be a passive electrical component, such as a capacitor, a resistor or an inductor.

The filler 102 may include a molding compound, bismaleimide triazine (BT), a polyimide (PI), a polybenzoxazole (PBO), a solder resist, an Ajinomoto build-up film (ABF), a polypropylene (PP), an epoxy-based material (e.g., an epoxy resin including fillers dispersed therein), or a combination of two or more thereof. As shown in the dotted box A, the filler 102 fills the gap between the electronic components and the sidewalls of the cavity. The filler 102 surrounds the electronic components in the cavity. The filler 102 fixes the electronic components in the cavity.

The interconnection layers 11 are disposed on surfaces (e.g., a top surface and a bottom surface) of the substrate 10. The interconnection layers 11 include redistribution layers (RDL), and may include conductive units (such as pads, wires, and/or vias) and a dielectric layer. A portion of the conductive units is covered or encapsulated by the dielectric layer while another portion of the conductive units is exposed from the dielectric layer to provide electrical connections for the substrate 10 (and the electronic components in the cavities of the substrate 10), the electronic components 12, and the electrical contacts 14.

The electronic components 12 are disposed on a surface of the interconnection layer 11 facing away from the substrate 10. The electronic components 12 may include, for example, a chip or a die including a semiconductor substrate. The electronic components 12 may include one or more integrated circuit devices and one or more overlying interconnection structures. The integrated circuit devices may include active devices such as transistors and/or passive devices such as resistors, capacitors, inductors, or a combination thereof. In some embodiments, there may be any number of electronic components 12 depending on design specifications.

The encapsulating layer 13 is disposed on the interconnection layer 11 to cover or encapsulate the electronic components 12. The encapsulating layer 13 may include, for example, a molding compound, a PI, an epoxy-based material, a phenolic compound or material, a material with a silicone dispersed therein, or a combination thereof.

The electrical contacts 14 are disposed on a surface of the interconnection layer 11 facing away from the substrate 10 and can provide electrical connections between the semiconductor device package 1 and external components (e.g. external circuits or circuit boards). The electrical contacts 14 (e.g. solder balls) may include a controlled collapse chip connection (C4) bump, a ball grid array (BGA) or a land grid array (LGA). In some embodiments, the electrical contacts 14 can be used for a fan-in structure, a fan-out structure, or a combination of the fan-in and fan-out structure. In some embodiments, there may be any number of electrical contacts 14 depending on design specifications.

Figure 2:
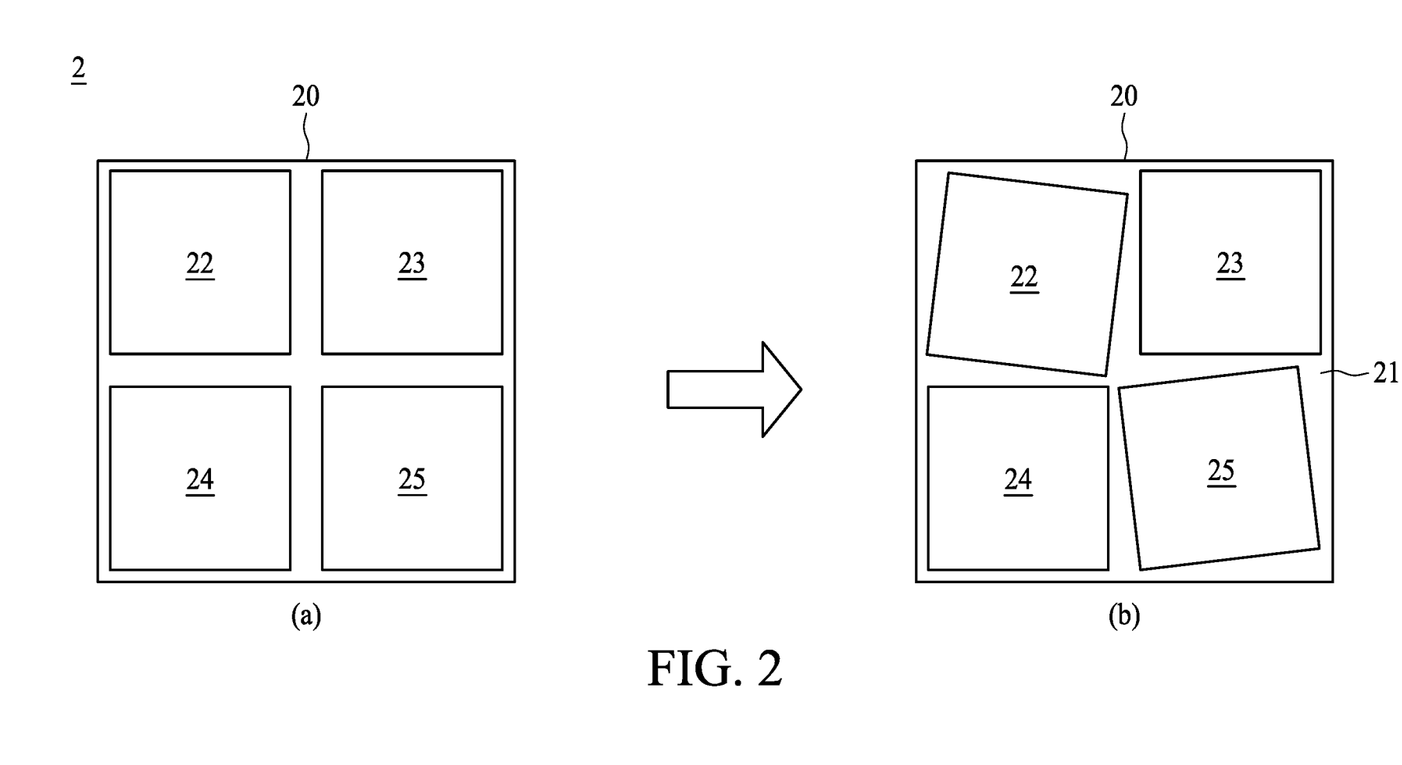
FIG. 2 illustrates a top view of a substrate in accordance with some embodiments of the present disclosure.

FIG. 2 illustrates a top view of a cavity 20 of a substrate 2 in accordance with some embodiments of the present disclosure. As shown in FIG. 2 (*a*), the substrate 2 includes the cavity 20, and electronic components 22, 23, 24, and 25 accommodated in the cavity 20. FIG. 2 (*b*) shows the cavity 20 further has a filler 21 disposed therein.

In some embodiments, the configuration of the substrate 10 in the semiconductor device package 1 may be replaced by the configuration of the substrate 2 in FIG. 2. The substrate 2 may have a material described for the substrate 10 with respect to FIG. 1.

In some embodiments, as mentioned, each of the electronic components (such as the electronic components 22, 23, 24, and 25) in the cavity 20 of the substrate 2 may be an active component or a passive electrical component. The passive electrical components may include a capacitor, a resistor an inductor, or a combination thereof. For examples, the electronic component 22 may be a capacitor, and the electronic component 23 may be a resistor. For examples, the electronic component 24 may be an inductor, and the electronic component 23 may be a resistor. In some embodiments, the passive electrical components may have different physical properties or specifications (such as different electrical parameters). For examples, the electronic component 22 may be a capacitor having a capacitance, and the electronic component 23 may be a capacitor having another capacitance. For examples, the electronic component 22 may be a resistor having a resistance, and the electronic component 23 may be a resistor having another resistance. For examples, the electronic component 22 may be an inductor having an inductance, and the electronic component 23 may be an inductor having another inductance. Different kinds of the electronic components with different electrical parameters may be chose depending on design specifications.

Compared with the design of a single one electronic component accommodated in one cavity, the design of more than one electronic component accommodated in one cavity (such as four electronic components from the top view as shown in FIG. 2) can achieve a higher total capacity of the electronic components in a semiconductor device package (such as the semiconductor device package 1 of FIG. 1). Therefore, the performance and the functionality of the latter design (as shown in FIG. 2) are better.

However, since the electronic components are picked and placed in the cavity one by one, the pick and place operations are time-consuming and inefficient.

In addition, the electronic components may shift or rotate from their original positions during the manufacturing process, such as during the operations of filling a filler. As can be seen in the operation flow from FIG. 2(a) to FIG. 2 (b), although the electronic components 22, 23, 24, and 25 may be placed in pre-setting positions in the cavity 20, they may shift or rotate from their original positions after the filler 21 is filled in the cavity 20. The filler 21 fills the remaining spaces (such as the gap between the electronic components, and the gap between the electronic components and the sidewalls of the cavity) in the cavity 20, and the relative positions of the electronic components are changed due to the external force from filling the filler 21. This may hinder the alignment operation in the following wiring or redistribution process (such as the operation illustrated in FIG. 6G) and may decrease the yield rate of the semiconductor device package.

Figure 3:
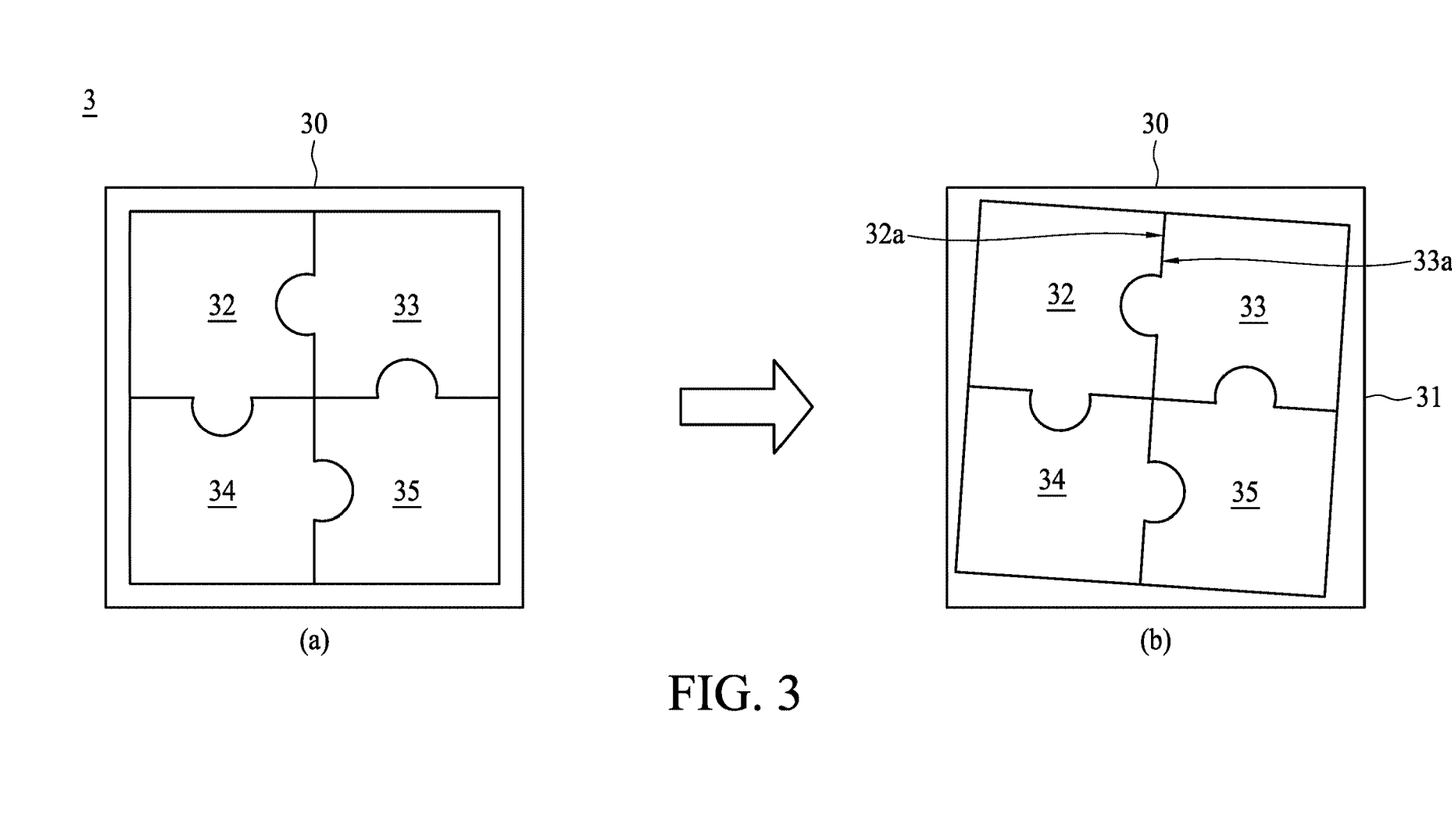
FIG. 3 illustrates a top view of a substrate in accordance with some embodiments of the present disclosure.

FIG. 3 illustrates a top view of a cavity 30 of a substrate 3 (or a top view of a portion of the substrate 10 in the dotted box A as shown in FIG. 1) in accordance with some embodiments of the present disclosure. As shown in FIG. 3 (a), the substrate 3 includes the cavity 30, and electronic components 32, 33, 34, and 35 in the cavity 30. FIG. 3 (b) shows the cavity 30 further has a filler 31 disposed therein.

The electronic components 32, 33, 34, and 35 are fastened and combined together as an integrated module. For examples, the electronic components 32, 33, 34, and 35 are together accommodated in the cavity 30. For examples, each of the electronic components 32, 33, 34, and 35 is in contact with adjacent ones. For examples, a surface 32a of the electronic component 32 and a surface 33a of the electronic component 33 face each other. The surface 32a of the electronic component 32 and the surface 33a of the electronic component 33 are in contact.

From a top view as shown in FIG. 3, the contours of the sides of the electronic components 32, 33, 34, and 35 are substantially matched. For examples, the surface 32a of the electronic component 32 has a recessing portion, and the surface 33a of the electronic component 33 has a protruding portion disposed in the recessing portion of electronic component 32. The protruding portion of the electronic component 33 is precisely fitted in the recessing portion of electronic component 32. The contour of the protruding portion of the electronic component 33 is substantially matched with the contour of the recessing portion of electronic component 32. The interface between the electronic component 32 and the electronic component 33 is devoid of void. The interface between the electronic component 32 and the electronic component 33 is devoid of gap.

By fastening and combining the electronic components 32, 33, 34, and 35 together as an integrated module, more than one electronic component may be combined before placed in a cavity. More than one electronic component can be placed in a cavity together in one pick and place operation, the efficiency is higher than the design described with respect to FIG. 2.

Besides, since the relative positions of the electronic components 32, 33, 34, and 35 are fixed, the yield rate of the semiconductor device package can be increased.

In addition, since each of the electronic components may be tested before being combined, unqualified components may be excluded earlier, and the yield rate can be increased.

Figure 5A:
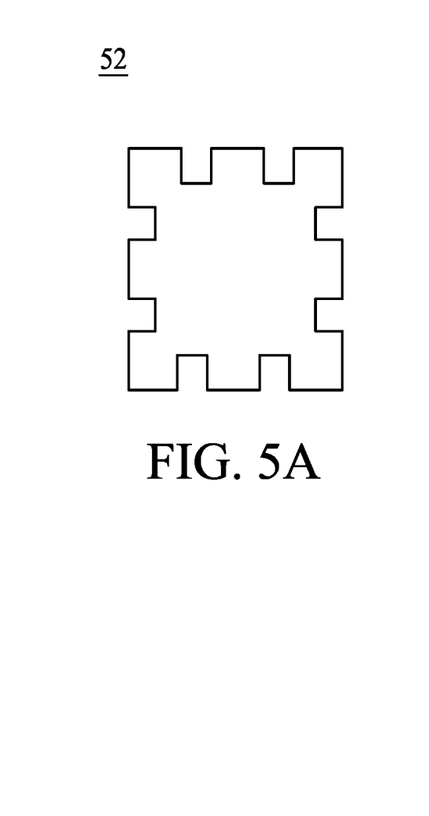
FIG. 5A illustrates a top view of an electronic component in accordance with some embodiments of the present disclosure.
Figure 5B:
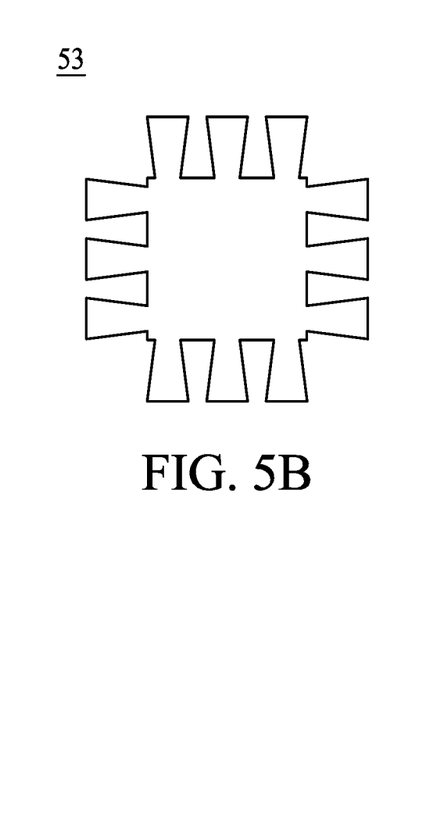
FIG. 5B illustrates a top view of an electronic component in accordance with some embodiments of the present disclosure.
Figure 5C:
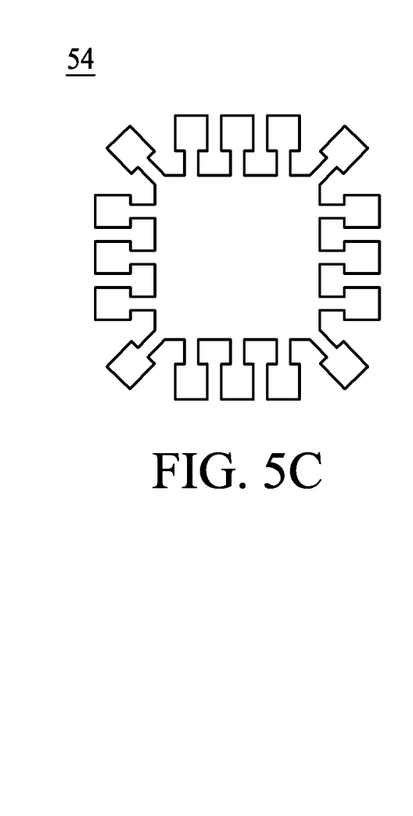
FIG. 5C illustrates a top view of an electronic component in accordance with some embodiments of the present disclosure.

In some embodiments, the contours of the surfaces of the electronic components 32, 33, 34, and 35 may have different configurations depending on design specifications, such as those shown in FIG. 5A, FIG. 5B, and FIG. 5C. FIG. 5A, FIG. 5B, and FIG. 5C illustrate top views of electronic components 52, 53, and 54, respectively, in accordance with some embodiments of the present disclosure.

As shown in FIG. 5A, the electronic component 52 has two recesses at one side, and the shapes of the recesses are substantially rectangles. The total side area of the electronic component 52 is higher than the electronic components 32, 33, 34, or 35 in FIG. 3. The more side area can help fasten the electronic components and fix their relative positions. In addition, the more side area can help disperse the stresses (such as the shear force) between the electronic components, and reduce the risk of warpages of the semiconductor device package.

As shown in FIG. 5B, the electronic component 53 has two recesses at one side and at the corners, and the sidewalls of the recesses are tapered. As shown in FIG. 5C, the electronic component 54 has four recesses at one side, and the sidewalls of the recesses have ladder-like shapes, and are not planar.

Figure 4:
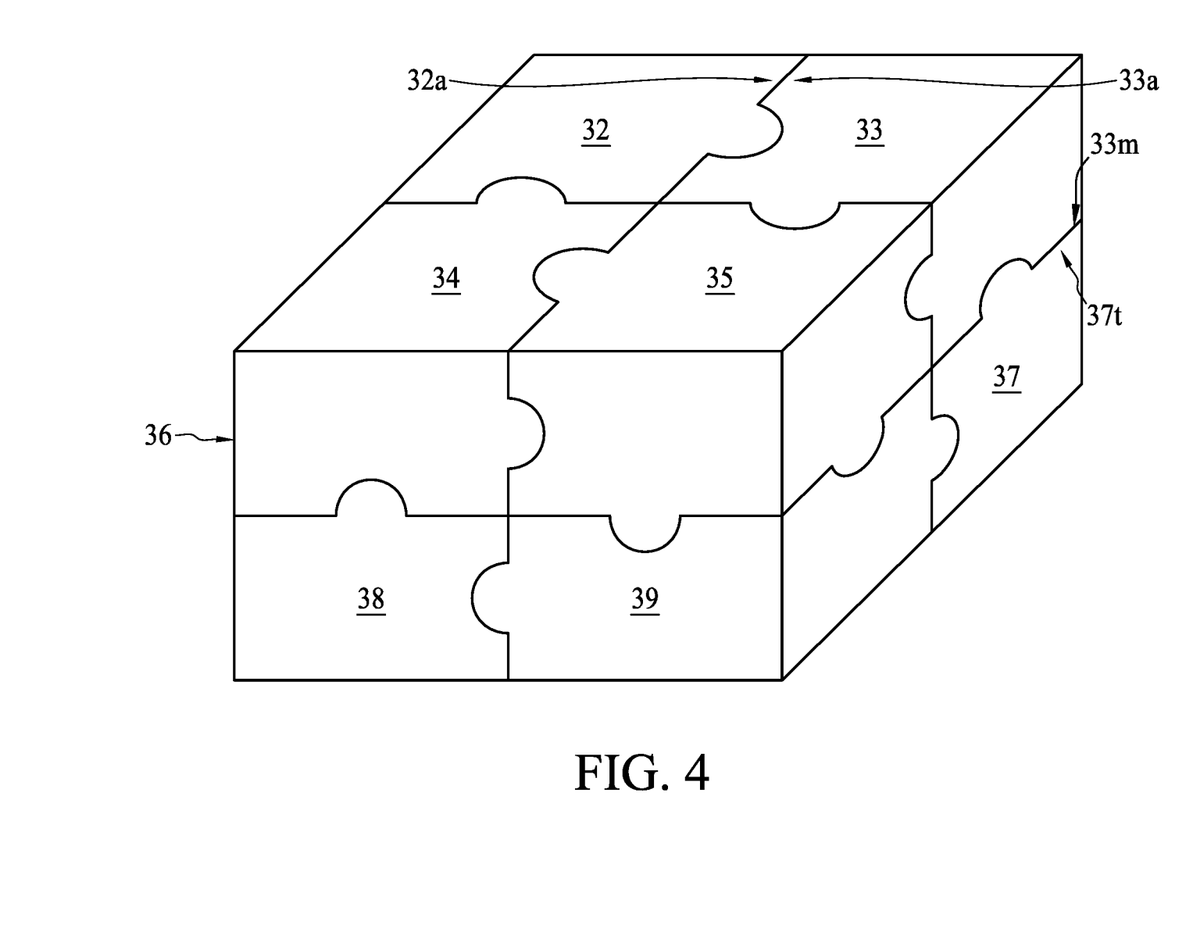
FIG. 4 illustrates a perspective view of a substrate in accordance with some embodiments of the present disclosure.

FIG. 4 illustrates a perspective view of an integrated module (or a perspective view of a portion of the substrate 10 in the dotted box A as shown in FIG. 1) in accordance with some embodiments of the present disclosure. The cavity and the filler surrounding the integrated module in FIG. 4 are omitted. The integrated module in FIG. 4 is similar to that of FIG. 3, and the differences therebetween are described below.

The integrated module in FIG. 4 includes the electronic components 32, 33, 34, and 35 integrated in 2 dimensional (2D) directions (such as in X-axis and Y-axis). Furthermore, the integrated module in FIG. 4 also includes electronic components 36, 37, 38, and 39 combined with the electronic components 32, 33, 34, and 35 in another direction (such as in Z-axis). The contours of the top surfaces of the electronic components 36, 37, 38, and 39 are substantially matched with the bottom surfaces of the electronic components 32, 33, 34, and 35, respectively. The top surfaces of the electronic components 36, 37, 38, and 39 are in contact with the bottom surfaces of the electronic components 32, 33, 34, and 35, respectively. In some embodiments, the interfaces between the top surfaces and the bottom surfaces are devoid of void. In some embodiments, the interfaces between the top surfaces and the bottom surfaces are devoid of gap. For examples, as shown in FIG. 4, a surface 33m (such as a bottom surface substantially perpendicular to the surface 33a) of the electronic component 33 has a recessing portion, and a surface 37t (such as a top surface) of the electronic component 37 has a protruding portion disposed in the recessing portion of electronic component 33. The recessing portion of the electronic component 33 and the protruding portion of the electronic component 37 are substantially matched.

The electronic components in the integrated module in FIG. 4 are fastened and combined in 3 dimensional (3D) directions, which increases the total capacity of the electronic components in a semiconductor device package, and also increases the efficiency of the manufacturing process thereof.

FIG. 6A, FIG. 6B, FIG. 6C, FIG. 6D, FIG. 6E, FIG. 6F, and FIG. 6G are cross-sectional views of a semiconductor device package at various stages of fabrication, in accordance with some embodiments of the present disclosure. At least some of these figures have been simplified for a better understanding of the aspects of the present disclosure.

Figure 6A:
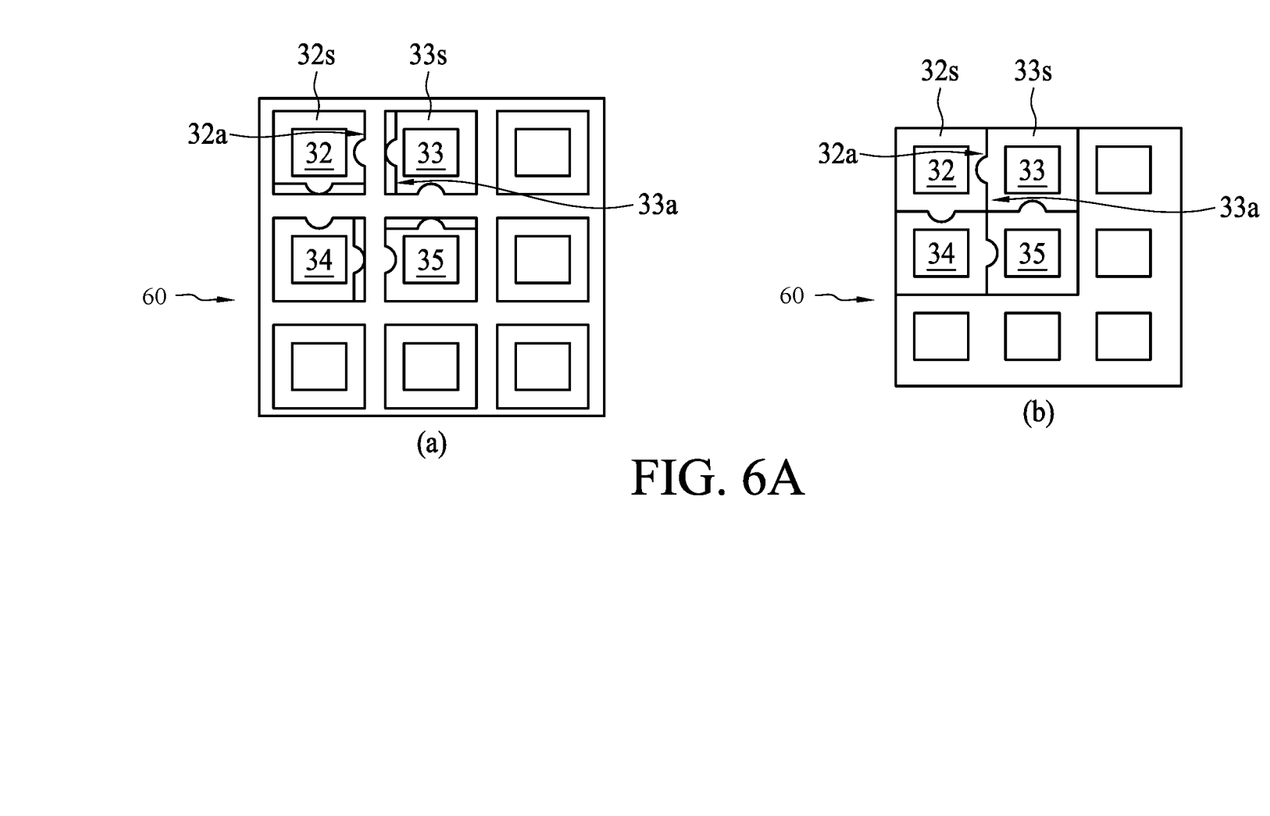
FIG. 6A illustrates one or more stages of a method of manufacturing a semiconductor device package in accordance with some embodiments of the present disclosure.

Referring to FIG. 6A (a), the electronic components (including the electronic components 32, 33, 34, and 35) are embedded in a plate 60. Each of the electronic components has an effective region, and the other regions in the plate 60 surrounding the effective regions are called ineffective regions in the present disclosure.

The operation in FIG. 6A (a) includes cutting out the electronic components and then shaping the electronic components with contours for combining and fixing. For examples, the electronic component 32 is cut out into a discrete unit having an ineffective region 32s and an effective region surrounded by the ineffective region 32s. The electronic component 33 is cut out into a discrete unit having an ineffective region 33s and an effective region surrounded by the ineffective region 33s. In some embodiments, the cutting operation may be performed, for example, by using a mechanical cutting (such as a dicing saw), laser, other appropriate cutting technique, or a combination thereof. The laser may achieve a higher preciseness, while the mechanical cutting is more efficient.

Then, the side 32a (at the ineffective region 32s) of the electronic component 32 is shaped to have a recessing portion. The side 33a (at the ineffective region 33s) of the electronic component 33 is shaped to have a protruding portion corresponding to the recessing portion of the electronic component 32. The protruding portion of the electronic component 33 and the recessing portion of the electronic component 32 are formed in different operations at different times. In some embodiments, the shaping operation may be performed, for examples, by using a mechanical cutting (such as a dicing saw), laser, other appropriate cutting technique, or a combination thereof. In some embodiments, a side at an ineffective region of an electronic component may be shaped to have a recessing portion, a protruding portion, or other shapes (such as those shown in FIGS. 5A to 5C). In some embodiments, a side at an effective region of an electronic component may be shaped to have a recessing portion, a protruding portion, or other shapes (such as those shown in FIGS. 5A to 5C)

FIG. 6A (b) illustrates an operation different from the operation in FIG. 6A (a). In FIG. 6A (b), the protruding portion of the electronic component 33 and the recessing portion of the electronic component 32 are formed in the same operation and at the same time. For examples, as shown in FIG. 6A (b), the protruding portion of the electronic component 33 and the recessing portion of the electronic component 32 already connected in the plate 60 and are together formed at one operation. The electronic components are cut out from the plate 60 at the same time after the shaping operation.

Figure 6B:
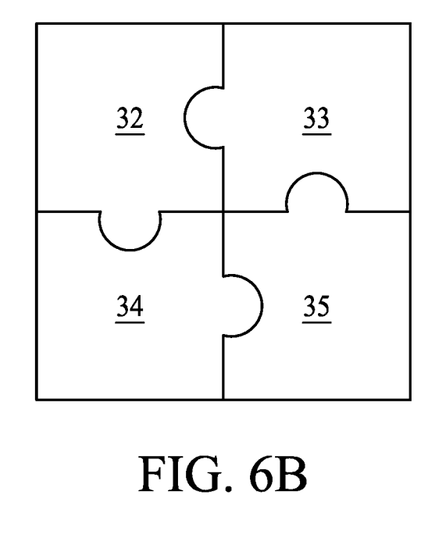
FIG. 6B illustrates one or more stages of a method of manufacturing a semiconductor device package in accordance with some embodiments of the present disclosure.

Referring to FIG. 6B, the electronic components 32, 33, 34, and 35 are fastened and combined together into an integrated module. In some embodiments, the electronic components 32, 33, 34, and 35 may combined through an adhesive layer or glue. In some embodiments, the electronic components 32, 33, 34, and 35 are in directly contact with the adjacent ones. The 2D or 3D integrated module (as shown in FIG. 4) may be obtained.

Figure 6C:
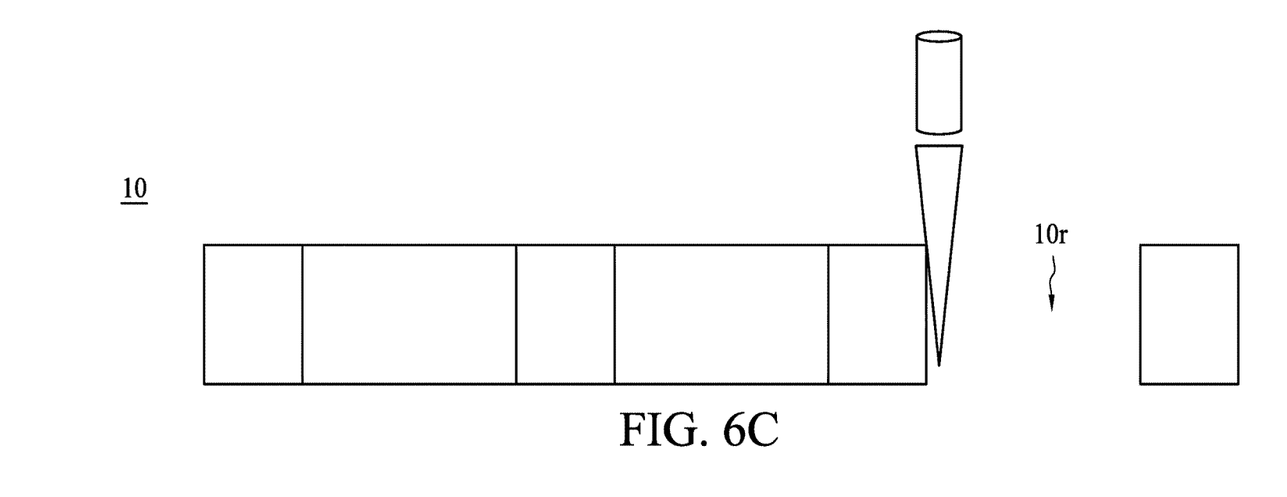
FIG. 6C illustrates one or more stages of a method of manufacturing a semiconductor device package in accordance with some embodiments of the present disclosure.

Referring to FIG. 6C, a substrate 10 is provided, and a plurality of cavities 10r are formed in the substrate 10 by a laser drill or by another appropriate technique.

Figure 6D:
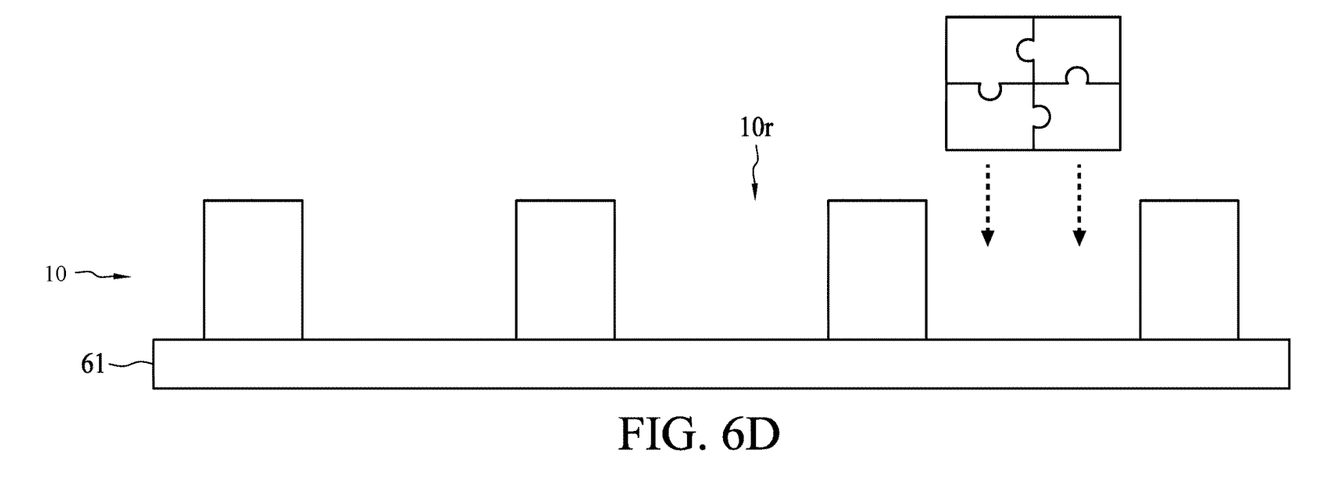
FIG. 6D illustrates one or more stages of a method of manufacturing a semiconductor device package in accordance with some embodiments of the present disclosure.
Figure 6E:
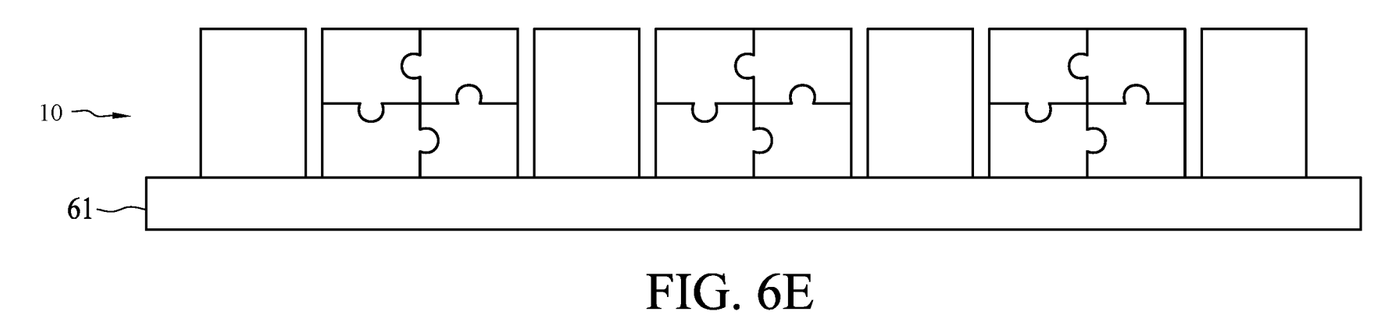
FIG. 6E illustrates one or more stages of a method of manufacturing a semiconductor device package in accordance with some embodiments of the present disclosure.

Referring to FIG. 6D, the substrate 10 is placed on a temporary carrier 61, and a 3D integrated module obtained in FIG. 6B is putted in the cavities 10r. By this way, more than one electronic component can be putted in one cavity 10r in the same operation and at the same time. The structure obtained from the operation in FIG. 6D is illustrated in FIG. 6E. In some embodiments, the electronic components 32, 33, 34, and 35 may be putted in the cavities 10r and then combined together in the cavities 10r.

Figure 6F:
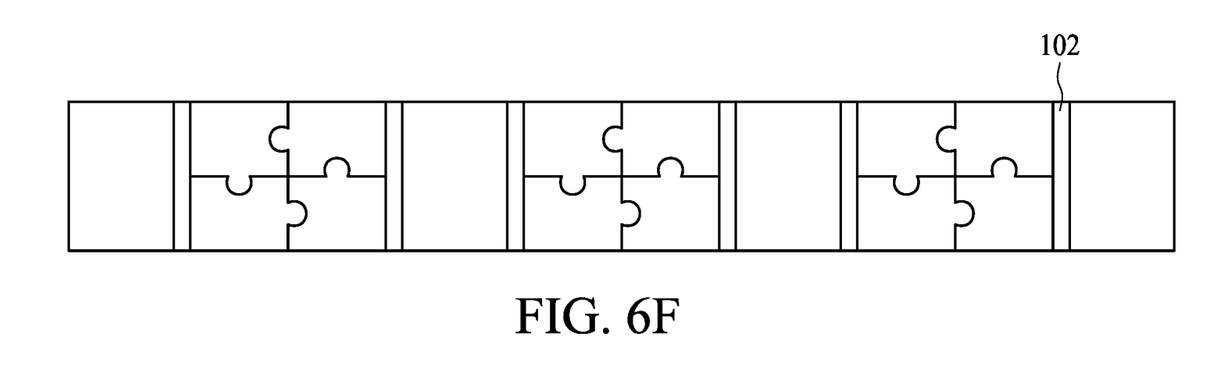
FIG. 6F illustrates one or more stages of a method of manufacturing a semiconductor device package in accordance with some embodiments of the present disclosure.

Referring to FIG. 6F, a filler 102 is disposed inside the cavities 10r. The temporary carrier 61 is removed from the substrate 10.

Figure 6G:
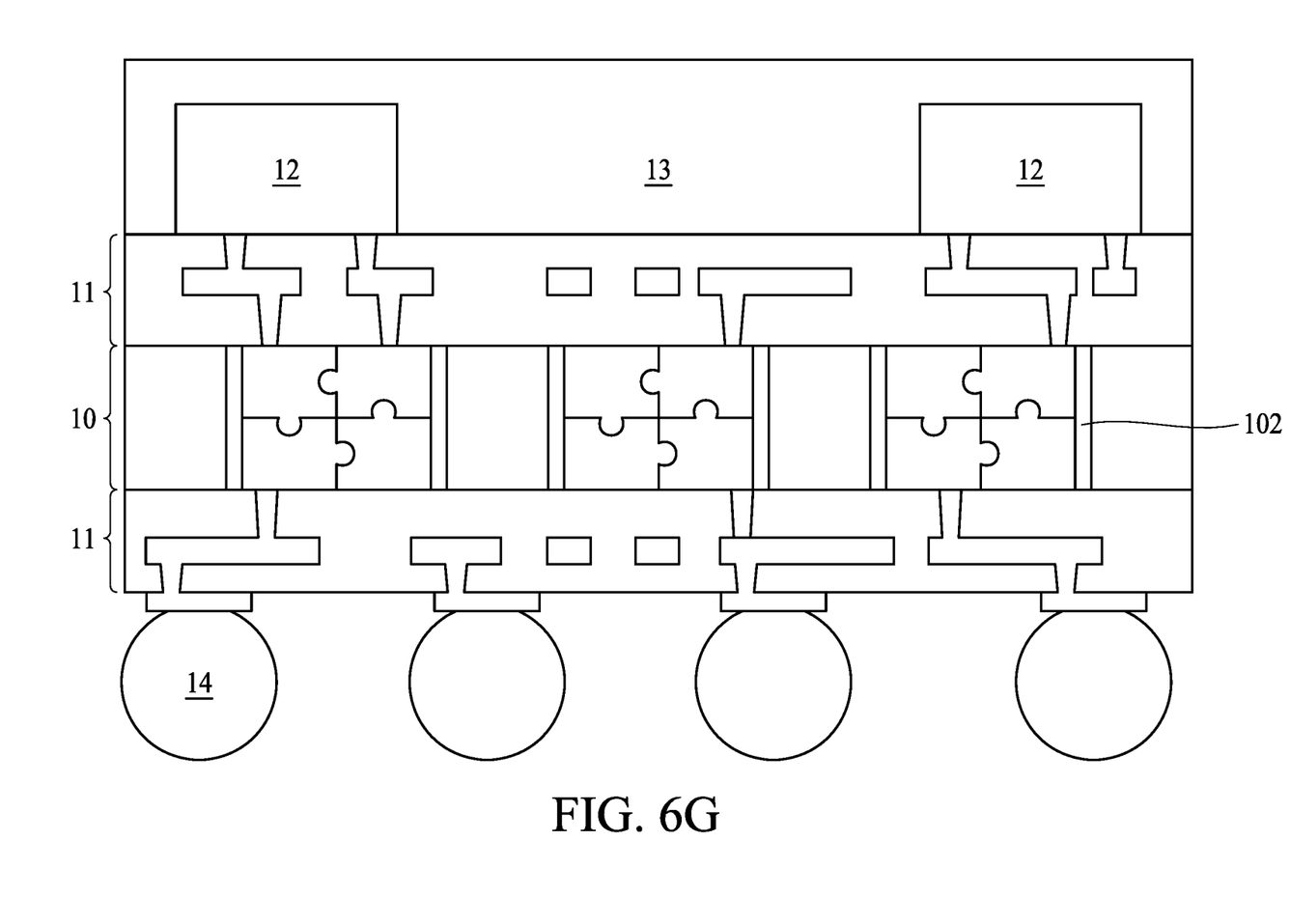
FIG. 6G illustrates one or more stages of a method of manufacturing a semiconductor device package in accordance with some embodiments of the present disclosure.

Referring to FIG. 6G, interconnection layers 11 are provided on both sides of the substrate 10. In some embodiments, the interconnection layers 11 may be formed through patterning a photoresist film (or a mask) by, for examples, lithographic technique, to expose a portion of the dielectric layer. Conductive units may be formed by, for examples, sputtering, electroless plating, printing, or other suitable processes.

In some embodiments, one or more electronic components 12 are disposed on a surface of the interconnection layer 11 facing away from the substrate 10 by a capillary or through other tools. In some embodiments, the electronic components may be disposed on an adhesive layer, glue or other intermediate layers for die-attaching. In some embodiments, an encapsulating layer 13 is disposed on the interconnection layer 11 to cover or encapsulate the electronic components 12. In some embodiments, the encapsulating layer 13 may be formed by a molding technique, such as transfer molding or compression molding. In some embodiments, one or more electrical contacts 14 may be provided on a surface of the interconnection layer 11 facing away from the substrate 10.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first passive component having an effective region and an ineffective region surrounding the effective region of the first passive component, wherein the first passive component includes a first surface having a recessing portion, and wherein the recessing portion is at the ineffective region of the first passive component;
a second passive component having an effective region and an ineffective region surrounding the effective region of the second passive component, wherein the second passive component includes a second surface facing the first surface of the first passive component, wherein the second surface includes a protruding portion within the recessing portion of the first surface of the first passive component, and wherein the protruding portion is at the ineffective region of the second passive component;
an interconnection layer disposed on the first passive component and the second passive component, wherein the interconnection layer is electrically connected with the effective region of the first passive component and the effective region of the second passive component; and
a substrate having a cavity, wherein the first passive component and the second passive component are accommodated in the cavity;
wherein a contour of the protruding portion and a contour of the recessing portion are substantially matched;
wherein the first surface of the first passive component is in contact with the second surface of the second passive component; and
wherein the substrate has a top surface and a bottom surface opposite to the top surface, the first passive component has a third surface opposite to the first surface of the first passive component, and the second passive component has a fourth surface opposite to the second surface of the second passive component, wherein the third surface of the first passive component is substantially coplanar with the top surface of the substrate, and wherein the fourth surface of the second passive component is substantially coplanar with the bottom surface of the substrate.

2. The semiconductor device package as claimed in claim 1, wherein the first passive component and the second passive component are two different kinds of passive components.

3. The semiconductor device package as claimed in claim 1, wherein the first passive component and the second passive component are the same kind of passive components, and the first passive component and the second passive component have different electrical parameters.

4. The semiconductor device package as claimed in claim 1, further comprising:
a third passive component having a top surface, the top surface having a protruding portion, wherein
the second passive component has a bottom surface substantially perpendicular to the second surface and faces the top surface of the third passive component;
the bottom surface of the second passive component has a recessing portion;
the protruding portion of the top surface of the third passive component is disposed within the recessing portion of the bottom surface of the second passive component; and
a contour of the protruding portion of the top surface of the third passive component and a contour of the recessing portion of the bottom surface of the second passive component are substantially matched.

5. The semiconductor device package as claimed in claim 1, further comprising:
a filler inside the cavity and surrounding the first passive component and the second passive component, wherein the filler is spaced apart from an interface between the first surface of the first passive component and the second surface of the second passive component.

6. The semiconductor device package as claimed in claim 1, further comprising:
an electronic component disposed on the interconnection layer; and
an encapsulating layer disposed on the interconnection layer and encapsulating the electronic component, wherein the encapsulating layer covers the first passive component and the second passive component.

7. A semiconductor device package, comprising:
a substrate having a cavity;
a first electronic component having a first surface, the first surface having a recessing portion;
a second electronic component having a second surface facing the first surface of the first electronic component, the second surface includes a protruding portion within the recessing portion of the first surface of the first electronic component; and
a filler inside the cavity and surrounding the first electronic component and the second electronic component;
wherein the first electronic component and the second electronic component are combined and accommodated in the cavity;
wherein the first surface of the first electronic component is in contact with the second surface of the second electronic component to define an interface therebetween;
wherein the filler is outside of the interface; and
wherein the substrate has a top surface and a bottom surface opposite to the top surface, the first electronic component has a third surface opposite to the first surface of the first electronic component, and the second electronic component has a fourth surface opposite to the second surface of the second electronic component, wherein the third surface of the first electronic component is substantially coplanar with the top surface of the substrate, and wherein the fourth surface of the second electronic component is substantially coplanar with the bottom surface of the substrate.

8. The semiconductor device package as claimed in claim 7, wherein the first electronic component has an effective region and an ineffective region surrounding the effective region, wherein the recessing portion is at the ineffective region.

9. The semiconductor device package as claimed in claim 7, wherein the second electronic component has an effective region and an ineffective region surrounding the effective region, wherein the protruding portion is at the ineffective region.

10. The semiconductor device package as claimed in claim 7, further comprising:

a third electronic component having a top surface, the top surface having a protruding portion, wherein the second electronic component has a bottom surface substantially perpendicular to the second surface and faces the top surface of the third electronic component;

the bottom surface of the second electronic component has a recessing portion;

the protruding portion of the top surface of the third electronic component is disposed within the recessing portion of the bottom surface of the second electronic component;

wherein the first electronic component, the second electronic component, and the third electronic component are combined and accommodated in the cavity.

11. The semiconductor device package as claimed in claim 7, further comprising:

a redistribution layer disposed on the substrate and having a surface facing the substrate, wherein the interface is non-parallel with the surface of the redistribution layer.

12. The semiconductor device package as claimed in claim 11, further comprising:

a third electronic component disposed on the redistribution layer; and an encapsulating layer disposed on the redistribution layer and encapsulating the third electronic component, wherein the encapsulating layer covers the first electronic component and the second electronic component.

* * * * *